(12) United States Patent
Kishimoto

(10) Patent No.: US 10,886,468 B2
(45) Date of Patent: Jan. 5, 2021

(54) MANUFACTURING METHOD AND MANUFACTURING APPARATUS FOR ORGANIC EL DISPLAY DEVICE

(71) Applicant: Sakai Display Products Corporation, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 56 days.

(21) Appl. No.: 16/079,719

(22) PCT Filed: Apr. 14, 2017

(86) PCT No.: PCT/JP2017/015381
§ 371 (c)(1),
(2) Date: Dec. 19, 2018

(87) PCT Pub. No.: WO2018/189906
PCT Pub. Date: Oct. 18, 2018

(65) Prior Publication Data
US 2020/0006658 A1  Jan. 2, 2020

(51) Int. Cl.
| | | |
|---|---|---|
| H01L 21/00 | (2006.01) | |
| H01L 51/00 | (2006.01) | |
| C23C 14/04 | (2006.01) | |
| C23C 14/24 | (2006.01) | |
| H01L 27/32 | (2006.01) | |
| H01L 51/56 | (2006.01) | |

(52) U.S. Cl.
CPC ........ *H01L 51/0011* (2013.01); *C23C 14/042* (2013.01); *C23C 14/24* (2013.01);
(Continued)

(58) Field of Classification Search
CPC ............. H01L 51/0011; H01L 27/3244; H01L 51/001; H01L 51/56; C23C 14/042; C23C 14/24
See application file for complete search history.

(56) References Cited

U.S. PATENT DOCUMENTS

2003/0124764 A1  7/2003  Yamazaki et al.
2007/0066177 A1  3/2007  Johnson et al.
(Continued)

FOREIGN PATENT DOCUMENTS

CN  203932122 U  11/2014
JP  2004217970 A  8/2004
(Continued)

OTHER PUBLICATIONS

English Translation of the International Preliminary Report on Patentability, PCT Application No. PCT/JP2017/015381, dated Oct. 24, 2019.
(Continued)

*Primary Examiner* — Richard A Booth
(74) *Attorney, Agent, or Firm* — Snell & Wilmer L.L.P.

(57) ABSTRACT

In a manufacturing method for an organic EL display device according to an embodiment, a support substrate is mounted on a surface of a vapor deposition mask (S3) which surface faces a vapor deposition source and has been subjected to a modification treatment (S2), and a desired organic material is evaporated to the vapor deposition mask, so as to deposit an organic layer formed of multiple layers in a desired area on the support substrate (S4), and further a second electrode is formed on the organic layer (S8). An exposed surface of the vapor deposition mask or an exposed surface of the organic layer formed on the vapor deposition mask is modified at at least one timing among: before depositing the organic layer formed of the multiple layers; before or after depositing each organic layer of the multiple layers forming the organic layer; and before forming the second electrode.

15 Claims, 5 Drawing Sheets

(52) U.S. Cl.
CPC ........ *H01L 27/3244* (2013.01); *H01L 51/001* (2013.01); *H01L 51/56* (2013.01); *H01L 2227/323* (2013.01)

(56) References Cited

U.S. PATENT DOCUMENTS

| | | |
|---|---|---|
| 2013/0302937 A1 | 11/2013 | Jinbo et al. |
| 2016/0047030 A1 | 2/2016 | Obata et al. |
| 2016/0083834 A1* | 3/2016 | Yamazaki ............ C23C 14/042 427/248.1 |
| 2016/0168691 A1 | 6/2016 | Takeda et al. |
| 2017/1007606 | 4/2017 | Jinbo et al. |

FOREIGN PATENT DOCUMENTS

| | | |
|---|---|---|
| JP | 2007084933 A | 4/2007 |
| JP | 2008308766 A | 12/2008 |
| JP | 2009117231 A | 5/2009 |
| JP | 2011214078 A | 10/2011 |
| JP | 2011231343 A | 11/2011 |
| JP | 2014007387 A | 1/2014 |
| JP | 2014208899 A | 11/2014 |
| JP | 2014218735 A | 11/2014 |
| JP | 3202183 U | 1/2016 |
| JP | 2016065310 A | 4/2016 |
| JP | 2016092148 A | 5/2016 |
| JP | 2017014582 A | 1/2017 |
| KR | 20110089549 A | 8/2011 |

OTHER PUBLICATIONS

PCT International Search Report, International Application No. PCT/JP2017/015381, Japan Patent Office dated Jul. 4, 2017.

English Translation of PCT International Search Report, International Application No. PCT/JP2017/015381, Japan Patent Office dated Jul. 4, 2017.

* cited by examiner

MANUFACTURING METHOD AND MANUFACTURING APPARATUS FOR ORGANIC EL DISPLAY DEVICE

CROSS-REFERENCE TO RELATED APPLICATIONS

This patent application is a U.S. National Stage of PCT/JP2017/015381, filed 14 Apr. 2017.

TECHNICAL FIELD

The present invention relates to a manufacturing method and a manufacturing apparatus for an organic EL display device.

BACKGROUND ART

When manufacturing an organic EL display device, driving elements such as TFTs, and so on are formed, for example, on a support substrate. On them, an organic layer is deposited for each pixel. The organic layer is weak to water and thus cannot withstand etching. Therefore, a vapor deposition mask is superposed on a substrate for vapor deposition to deposit organic materials through the vapor deposition mask, and a required organic layer is deposited only on required pixels.

On the other hand, the vapor deposition mask is not only used for vapor deposition on one substrate for vapor deposition, but can also be used for sequential vapor deposition on a plurality of substrates for vapor deposition. Further, even when performing vapor deposition for the same pixel on the same substrate for vapor deposition, the organic material to be deposited may in some cases be replaced, or the same vapor deposition mask may in other cases be used again after another step. Thus, in an area of the vapor deposition mask where there is no opening, the organic materials are deposited to gradually increase in thickness. If the deposition of the organic materials increases, there is a risk that a portion of the organic materials attached to the vapor deposition mask may be peeled off and transferred to the substrate for vapor deposition, and further attached to an unintended part of the substrate for vapor deposition. For this reason, a vapor deposition mask with organic materials deposited to a certain thickness is cleaned to remove the organic material (for example, refer to Patent Document 1). Patent Document 1 discloses that shock wave generated by laser irradiation is used to remove the organic material attached to the mask.

PRIOR ART DOCUMENTS

Patent Document

Patent Document 1: JP 2009-117231 A

SUMMARY OF THE INVENTION

Problem to be Solved by the Invention

In order to remove the materials attached to the vapor deposition mask, a very long time such as 4 to 5 hours is required for each vapor deposition mask. On the other hand, the vapor deposition time to deposit one layer of organic material on one substrate for vapor deposition is on the order of a few tens of seconds to a few minutes. If one vapor deposition mask is used repeatedly, the layer formation rate of an organic material is about 1 Å/s even when it is a material with a low layer formation rate, and therefore, the time for depositing the organic layer to reach a deposition thickness (for example, about 1 μm) which corresponds to a thickness of the removal of the organic layer is about 150 minutes at maximum. Thus, the time of the vapor deposition process is restricted by the cleaning time of the vapor deposition mask to be long. In order to finish the vapor deposition process in a short time, very many spare vapor deposition masks are required. This is a problem because this causes an increase in cost.

Conventionally, the vapor deposition mask is a metal mask. However, in recent years, a display device is required to have a higher definition with smaller pixels, and therefore, there is a tendency to use a resin mask made of a resin film with openings formed therein, or a complex type mask made of a resin mask which is partially reinforced with a metal support layer. This is because the use of a resin film makes it easier to form a pattern of fine openings by laser processing or the like. Thus, as the definition of the display device becomes higher, there is a possibility to use a vapor deposition mask, at least a part of the opening is made only of a resin film. In addition, the pattern of the openings becomes finer. Therefore, if the vapor deposition mask is cleaned repeatedly, a problem arises that the vapor deposition mask, namely the resin film, is likely to be damaged near its openings. This causes another problem that the life of the vapor deposition mask, which is expensive, is shortened.

The present invention has been made in view of the above, and an object of the present invention is to delay as much as possible the timing of cleaning to remove an unnecessary organic layer deposited on the vapor deposition mask so as to reduce the number of spare vapor deposition masks or shorten the cycle time of the vapor deposition process, thereby reducing the manufacturing cost of the organic EL display device.

Another object of the present invention is to reduce the number of cleanings relative to the frequency in use of the vapor deposition mask so as to extend the life of the vapor deposition mask, thereby reducing the manufacturing cost of the organic EL display device.

Means to Solve the Problem

A manufacturing method for an organic EL display device according to an embodiment of the present invention comprises: preparing a support substrate having at least TFTs and a first electrode formed thereon; mounting the support substrate on a vapor deposition mask placed in a vapor deposition chamber so that the first electrode faces the vapor deposition mask; evaporating an organic material from a position distant from the vapor deposition mask toward a surface of the vapor deposition mask, the surface of the vapor deposition mask being an opposite surface to a surface facing the support substrate, so as to deposit an organic layer composed of multiple layers; and forming a second electrode on the organic layer, wherein a modification treatment to modify an exposed surface of the vapor deposition mask or an exposed surface of the organic layer deposited on the vapor deposition mask is performed at at least one timing among: before depositing the organic layer composed of the multiple layers; before or after depositing each organic layer of the multiple layers composing the organic layer; and before forming the second electrode.

A manufacturing apparatus for an organic EL display device according to an embodiment of the present invention comprises: a vapor deposition chamber for depositing an organic material; a reduced pressure cluster connected to the vapor deposition chamber through a gate valve for taking in or out the vapor deposition mask in the vapor deposition chamber; a mask stocker connected to the reduced pressure cluster through a gate valve for storing spare vapor deposition masks; and a modification treatment device for modifying a surface of the vapor deposition mask or a surface of the organic material deposited on the vapor deposition mask.

Effects of the Invention

According to an embodiment of the present invention, the number of cleanings relative to the frequency in use of the vapor deposition mask can be reduced, and the life of the vapor deposition mask can be extended, thereby reducing the manufacturing cost of the organic EL display device is obtained.

EMBODIMENT FOR CARRYING OUT THE INVENTION

Figure 1:
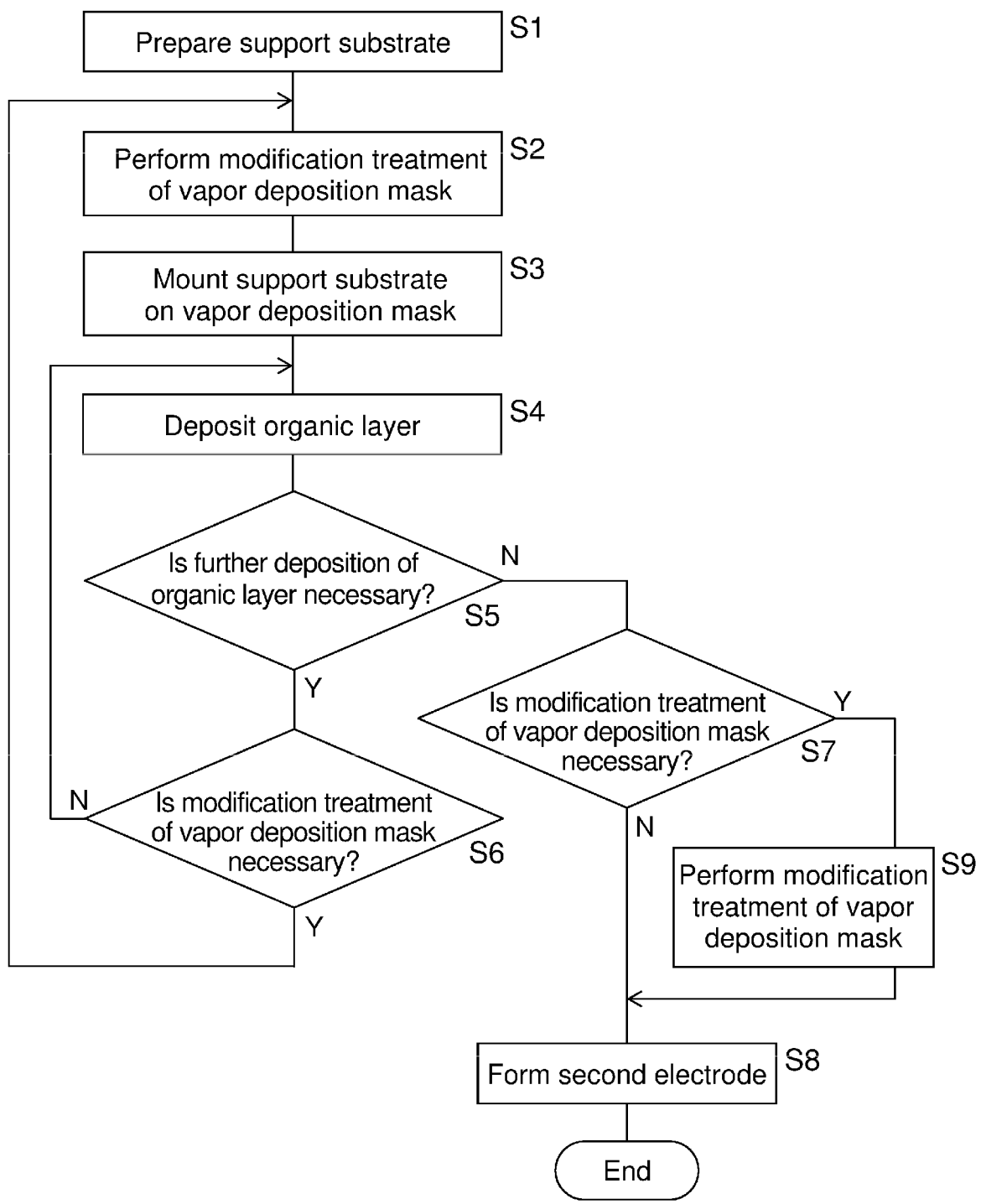
FIG. 1 is a flow chart of a manufacturing method for an organic EL display device according to a first embodiment of the present invention.
Figure 4A:
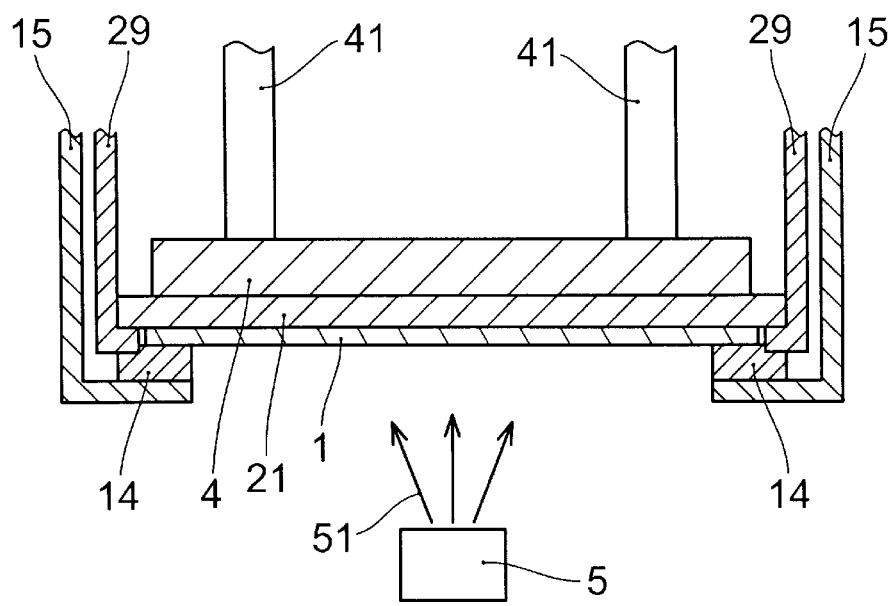
FIG. 4A is a view showing a relationship between a support substrate and a vapor deposition mask in an organic material deposition process.
Figure 5:
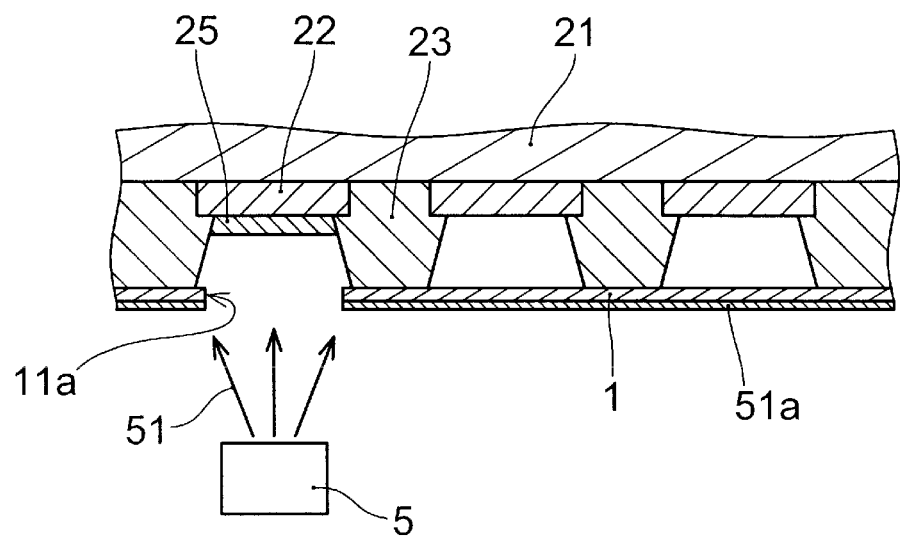
FIG. 5 is an explanatory view of the organic material deposition process as one step in the flow chart of FIG. 1.

Next, referring to the drawings, a manufacturing method and a manufacturing apparatus for an organic EL display device according to a first embodiment and a second embodiment of the present invention, respectively, will be described. FIG. 1 shows a flow chart of a manufacturing method for an organic EL display device according to the first embodiment, and FIG. 4A shows a configuration example of a manufacturing apparatus according to the second embodiment for depositing an organic material, while FIG. 5 shows a state where the organic material is deposited by these manufacturing method and manufacturing apparatus. They are for illustration purposes, and these configurations are not limitative.

In the manufacturing method for an organic EL display device according to the first embodiment of the present invention, first, a support substrate 21 having at least TFTs (not shown) and a first electrode 22 (refer to FIG. 5) formed thereon is prepared (S1). Referring to FIG. 4A, a vapor deposition mask 1 having a surface which faces a vapor deposition source 5 and which has been subjected to a modification treatment (S2) is placed in a vapor deposition chamber (not shown). If the vapor deposition mask 1 has good contact force with a deposited layer, the modification treatment can be omitted. Here, good contact force means that the surface condition is in a state where there is no oxidation, no impurity, no contamination or the like, and is in a state where a new organic layer is closely contact to the surface easily. As a simple decision method, the contact force can be decided with reference to a time interval from a previous vapor deposition process, a thickness of an organic layer deposited after the modification treatment, and so on.

The support substrate 21 is mounted on the vapor deposition mask 1 so that a first electrode 22 of the support substrate 21 faces the vapor deposition mask 1 (S3). Thereafter, an organic material is evaporated from a position (vapor deposition source 5) distant from the vapor deposition mask 1 toward a surface of the vapor deposition mask 1, which is opposite to its surface facing the support substrate 21, so as to deposit an organic layer 25 formed of multiple layers (S4). Here, when each organic layer of the multiple layers of the organic layer 25 is deposited, it is decided whether further deposition of an organic layer is necessary (S5), and it is also decided whether modification treatment of the surface of the vapor deposition mask 1 is necessary (S6). If both are necessary (Yes (Y)), the process returns to step S2. If the modification treatment is not necessary in step S6 (No (N) in S6), the process returns to step S4 to further deposit an organic layer. Further, if the deposition of the organic layer is not necessary in step S5 (predetermined organic layer deposition is finished) (N in S5), it is decided whether modification treatment of the vapor deposition mask 1 is necessary (S7). If the modification treatment is not necessary (N in S7), a second electrode 26 (refer to FIG. 8) is formed (S8), and the process for depositing using vapor deposition mask ends. If the modification treatment is necessary in step S7 (Y in S7), the modification treatment of the vapor deposition mask 1 is performed (S9), and the second electrode 26 is formed (S8).

Thus, the present embodiment is characterized in that a modification treatment for modifying an exposed surface of the vapor deposition mask 1 or an exposed surface of an organic layer 51a (refer to FIG. 5) formed on the vapor deposition mask 1 is performed at at least one timing among: before depositing the organic layer 25 composed of multiple layers; before or after depositing each organic layer of the multiple layers of the organic layer 25; and before forming the second electrode 26 (S2, S9). The decision in step S5 is a decision of whether or not a desired organic deposition layer is finished. The decision in step S6 is a decision which is made at a timing when the support substrate 21 and the vapor deposition mask 1 move relative to each other or are replaced, and which is made based on the amount (thickness) of the organic layer 51a deposited on the surface of the vapor deposition mask 1 and based on the surface condition (its criterion being defined by oxidation, attached substance, contamination and so on).

The deposition of the organic layer composed of multiple layers is performed by replacing the vapor deposition chamber and moving the support substrate 21 to a different vapor deposition chamber provided with a different vapor deposition mask, or by replacing the vapor deposition mask 1 in the same deposition chamber, and the modification treatment is performed, if necessary, when the support substrate 21 is moved, or when the vapor deposition mask 1 is replaced. More specifically, for mass production, a different vapor deposition mask 1 is placed in each of a plurality of vapor deposition chambers. While the same support substrate 21 is moved through different ones of the vapor deposition chambers, organic materials are sequentially deposited thereon using different vapor deposition masks (S4). This state is referred to as movement of the support substrate 21. On the other hand, in an experimental apparatus or the like, organic materials may in some cases be deposited in the same vapor deposition chamber by replacing the vapor deposition mask 1. This state means replacement of the vapor deposition mask 1. Thus, either one of the support substrate 21 or the vapor deposition mask 1 is changed relative to the other, therefore the movement (or replacement) of the support substrate 21 described above is included in the replacement of the vapor deposition mask 1.

As described above, the modification treatment of the vapor deposition mask 1 is performed, if necessary, before the vapor deposition mask 1 is placed in the vapor deposition chamber, and further the modification treatment is performed at the time of the relative movement of the support substrate 21 and at a necessary timing. Thus, it is not necessary to temporarily stop the manufacturing process especially for the modification treatment, thereby achieving efficiency. The decision of whether to perform the modification treatment of the vapor deposition mask 1 is made based on: the thickness of the organic layer deposited on the vapor deposition mask 1; the oxidation state of the surface of the organic layer; the condition of attached impurities; and so on. However, the modification treatment can also be performed periodically based on the elapse of a certain time, the thickness of the deposited organic layer, and so on.

Figure 6:
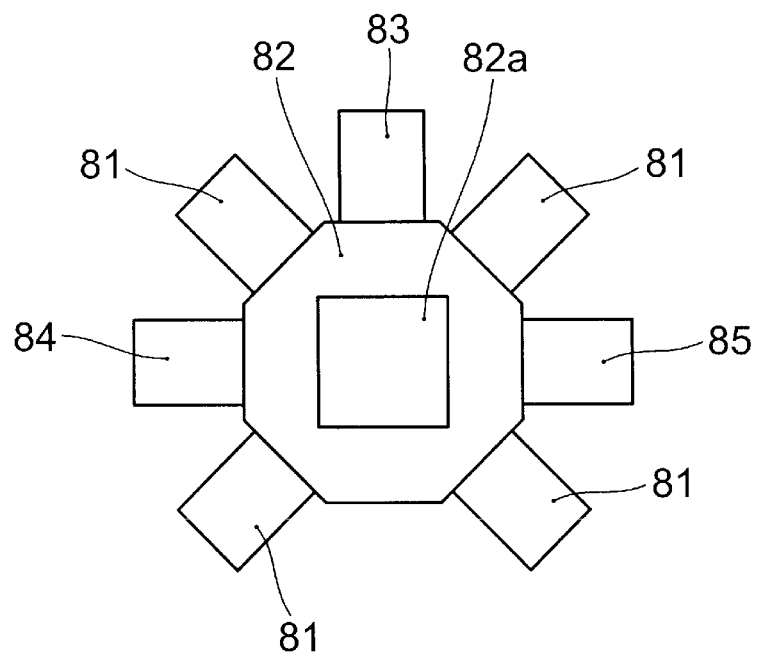
FIG. 6 is a view showing a configuration example of a main part of a manufacturing apparatus according to a second embodiment of the present invention, and showing an outline of a system to replace the vapor deposition mask.
Figure 7:
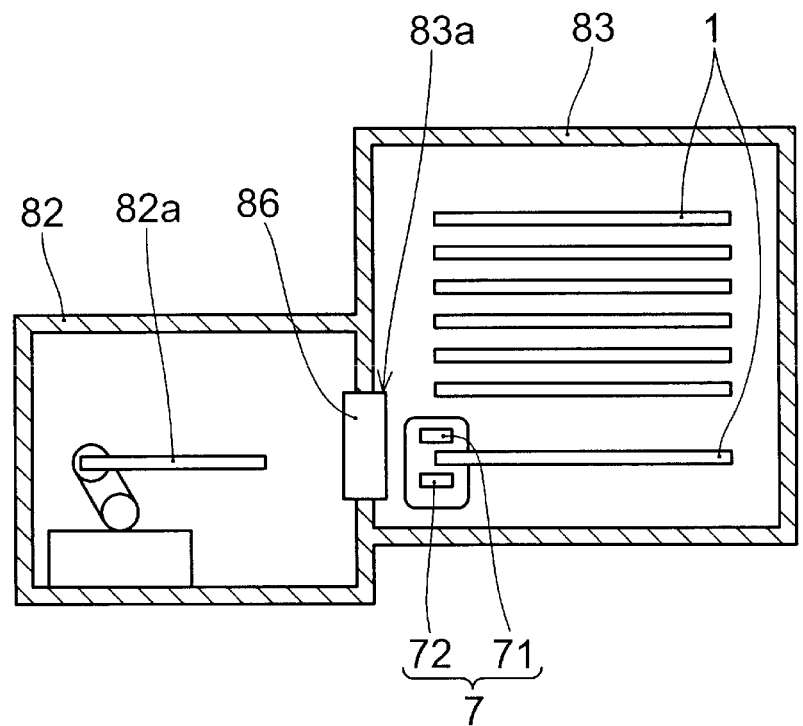
FIG. 7 is a schematic explanatory view of an example in which a reduced pressure cluster and a mask stocker shown in FIG. 6 are connected through a gate valve.

Further, as shown in FIGS. 6 and 7, the manufacturing apparatus for an organic EL display device according to a second embodiment of the present invention comprises: a vapor deposition chamber 81 (refer to FIG. 6) for depositing an organic material; a reduced pressure cluster 82 connected to the vapor deposition chamber 81 through a gate value (not shown in FIG. 6, but similar to a gate valve 86 of FIG. 7) for taking in and out a support substrate 21 and a vapor deposition mask 1 in the vapor deposition chamber 81; a mask stocker 83 connected to the reduced pressure cluster 82 through a gate valve 86 (refer to FIG. 7) for storing the support substrate 21, a spare vapor deposition mask 1 to replace the vapor deposition mask 1, and so on; and a modification treatment device for modifying the surface of the vapor deposition mask 1 or the surface of the organic material (organic layer 51a of FIG. 5) deposited on the vapor deposition mask 1.

The first embodiment is characterized in that the modification treatment of the vapor deposition mask 1 is performed in steps S2 and S9, and the second embodiment is characterized by the modification treatment device. More specifically, as described above, when the thickness of the organic layer 51a of an organic material deposited on an area of the vapor deposition mask 1 (refer to FIG. 5) other than the openings 11a increases to a certain thickness (for example, about 1 µm), a cleaning operation was conventionally performed to remove the organic layer 51a. This is to prevent the attached organic layer 51a from partially falling off or from forming a shadow during the vapor deposition. On the other hand, the present inventor conducted extensive studies for investigation, and as a result, has found that the deposition of even about 10 µm is not a significant impediment regarding the shadow. However, for example, when the support substrate 21 for vapor deposition is moved (re-placed), an occasion arises in which it contacts a small amount of oxygen in air. Consequently, in some cases, a thin oxide layer may be formed or impurities may be attached on the surface of the deposited organic layer 51a. If thus the oxide layer is formed or the impurities are attached, the contact force between the organic layer 51a and a new organic material deposited thereon is reduced. Therefore, the newly deposited organic material becomes likely to be partially peeled off, and the present inventor has found that this is one of the causes of its fall-off.

Further, if the thickness of the deposited organic layer 51a increases, the irregularities of the surface of the organic layer 51a are reduced, making it easier to flatten the surface of the organic layer 51a. If a new organic material is deposited on the flattened organic layer 51a, peeling is likely to occur at the boundary between them (avalanche phenomenon). The present inventor has found that the partial fall-off of the organic layer 51a is another cause of the fall-off of the attached material.

Further, the present inventor has found that when the surface of the organic layer 51a deposited on the area of the vapor deposition mask 1 other than the openings 11a (refer to FIG. 5) is subjected to a modification treatment such as activation, the modified surface of the organic layer 51a and the newly deposited organic material are tightly attached to each other, thereby reducing the partial fall-off of the organic layer 51a. The modification treatment is performed, for example, by activating the surface or forming a thin film on the surface to improve its contact force. The present inventor has also found that it is more effective if the vapor deposition mask 1 itself before being used as a mask is subjected to an activation treatment. Such a modification of the surface of the organic layer is performed by any one, for example, by plasma treatment using oxygen plasma or the like, corona discharge treatment, thermal treatment in a nitrogen or dry air atmosphere, ultraviolet radiation treatment, or further thin layer forming treatment to improve the contact force, or the like. In the following, an outline of each modification treatment device will be described in further detail.

Modification Treatment Device—1

Figure 2:
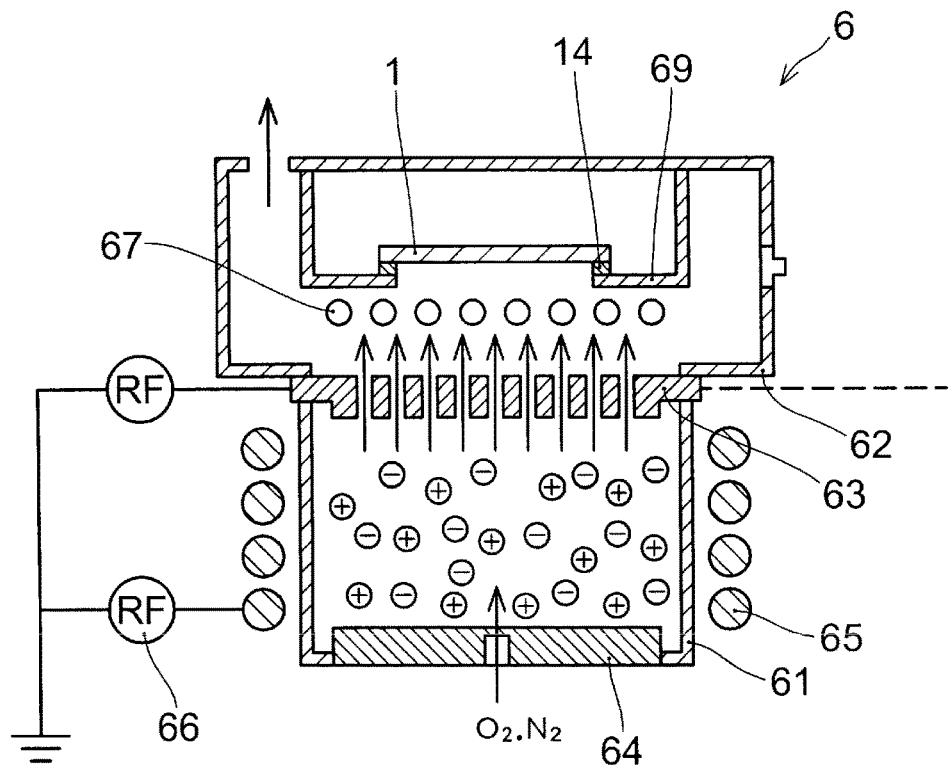
FIG. 2 is an explanatory view showing an example of a plasma generating device used in a modification treatment process as a step in the flow chart of FIG. 1.

As an example of a modification treatment, plasma treatment is suitable. An example of a plasma generating device 6 for plasma treatment has a configuration, for example, as schematically shown in FIG. 2. For example, a plasma chamber 61 and a process chamber 62 are connected to each other through a silicon shield plate 63. A coil 65 is wound, for example, around the plasma chamber 61. When a high frequency current flows in it from a high frequency power source 66, molecules in the plasma chamber 61 under reduced pressure are ionized by a high electric field. Thus, as shown in FIG. 2, when a reactive gas such as nitrogen, oxygen or the like is introduced from a bottom plate 64 and is supplied with a high electric field in a reduced pressure state, neutral particles are ionized into + (positive) ions and − (negative) ions. Although FIG. 2 shows that a large number of positive ions and negative ions are generated, the inside of the plasma chamber 61 can be in a state of weakly ionized plasma where the neutral particles are partially ionized and are mostly present unionized. In the plasma chamber 61, they are present in a neutral state where the positive ions and the negative ions can move around freely. Then, the neutral particles 67 propagate into the process chamber 62 through the silicon shield plate 63 to perform a modification treatment of the surface of the vapor deposition mask 1 which is an object to be treated and is placed on a mask holder 69. Note that a frame (frame body) 14 is formed at a periphery of the vapor deposition mask 1, and the vapor deposition mask 1 is held by the mask holder 69 at the frame 14. A surface of an organic layer (not shown in FIG. 2; refer to 51a of FIG. 5) deposited on the surface of the vapor deposition mask 1 is subjected to a modification treatment such as activation or the like.

Normally, plasma is generated under significantly low pressure, but plasma can also be generated under atmospheric pressure. Thus, the pressure can roughly be slightly reduced pressure (for example, about 700 Torr), and it is not necessary to prepare an apparatus in which the plasma chamber 61 and the process chamber 62 are combined. For example, it is possible that a plasma generating section is formed in the reduced pressure cluster 82 or the mask stocker 83 (for example, on its top plate or bottom plate) connected to the vapor deposition chamber 81 shown in FIG. 6 described above, and that a gas supply source for supplying therein a plasma generating gas such as nitrogen ($N_2$), oxygen ($O_2$) or the like, and a high frequency power source capable of forming a high frequency electric field are therein provided outside, respectively, to perform plasma treatment. The electric field to generate plasma is not limited to that of high frequency voltage, but can be that of DC voltage or microwave.

As a gas to generate plasma, $N_2$ and $O_2$ are preferable because they can reduce the contact angle in a short time, or in other words, perform surface modification in a short time. For example, it was confirmed that when the surface of an organic film such as polyimide is subjected to plasma treatment using $N_2$ plasma, the surface in a relatively smooth state becomes an irregular surface with distinct irregularities of particles after the treatment, when seeing through a scanning electron microscope. While the irregularities change in depth (height) depending on treatment time, the present inventor has found that the height of the irregularities of about 0.01 or more and 0.05 μm or less is sufficiently effective, because the purpose of the surface modification treatment in the present embodiment is to modify the surface. There is experimental data showing that about 0.1 second is sufficient for the modification treatment using $N_2$ or $O_2$ plasma. On the other hand, it was confirmed that about 10 seconds or more and 60 seconds or less is sufficient even when a large vapor deposition mask 1 of about 1.5 m square is subjected to plasma treatment in its entirety at one time, and that even when a linear plasma generator is used for scanning, scanning at about 1 cm per second is sufficient. Note that the plasma treatment can also be performed in air although it increases the treatment time a little, and the surface condition, after treatment, is not as good as using $N_2$ or $O_2$ plasma.

When the surface of the organic layer 51a attached to the surface of the vapor deposition mask 1 is subjected to such plasma treatment, the shape of particles appears on the surface, causing the irregularities to be distinct. As a result, even if an organic material is further deposited on the surface, the close contact on the irregularities increases due to the anchor effect. In addition, the surface of the organic layer 51a is activated, and therefore, its close contact force to a new organic material which comes flying increases in strength. Consequently, the already deposited organic layer 51a and the newly deposited organic material are closely attached to each other with no difference at all from a continuously deposited layer. It is considered that the contact force between the already deposited organic layer 51a and the newly deposited organic material increases significantly, making it unlikely for the organic layer 51a to partially fall off.

Modification Treatment Device—2

Figure 3:
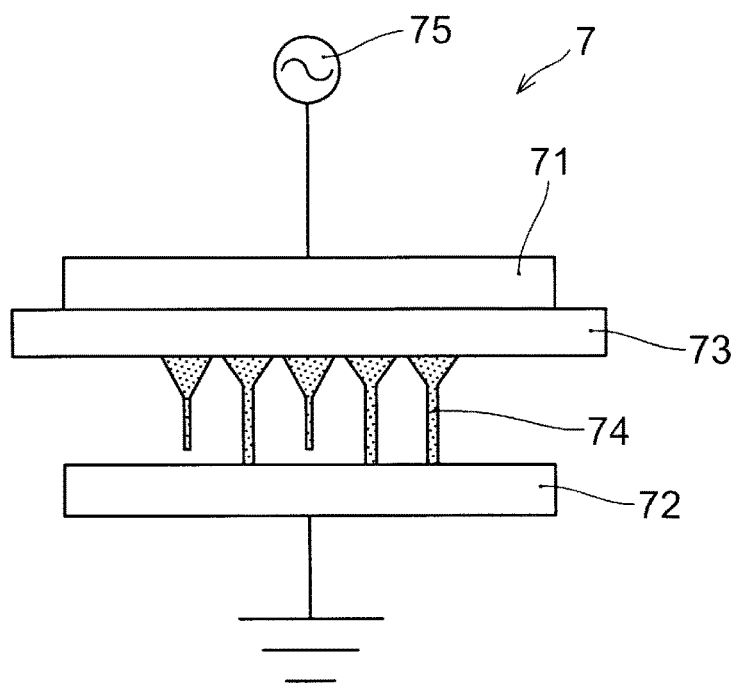
FIG. 3 is a view showing an example of a corona discharge device used in the modification treatment process as a step in the flow chart of FIG. 1.

As another example of a modification treatment, corona discharge treatment is suitable. As schematically shown in FIG. 3, a corona discharge device 7 is configured such that a dielectric material (insulating material) 73 is inserted between a pair of electrodes 71, 72, and a high frequency high voltage is applied from a power source 75. In this device, when a high frequency high voltage is applied from the power source 75, filamentary plasma 74 called streamer corona is generated between the pair of electrodes 71, 72 at random in time and space. Since the dielectric material 73 is inserted, the discharge does not shift to arc, and the discharge continues. In addition, the generation and extinction of the streamer corona are repeated on a nanosecond time scale, and therefore, the formation of hot plasma is reduced.

When an object to be treated passes through such a discharge, it is subjected to corona treatment. More specifically, electrons generated by corona discharge collide with the surface of the object to be treated to ionize and scatter particles on the surface. In the present embodiment, the vapor deposition mask 1 with the above-described organic layer 51a attached thereto is allowed to pass between the pair of electrodes 71, 72 to remove oxides and impurities on the surface of the organic layer 51a to activate and modify the surface of the organic layer 51a.

The irradiation time of corona discharge can be about 10 seconds or more and 120 seconds or less, and therefore, it is not necessary to specially prepare an exclusive corona discharge device 7. As shown in FIG. 7, the pair of electrodes 71, 72 can be formed in an existing equipment such as the mask stocker 83. In this case, a high frequency power source (not shown) is provided outside the mask stocker 83. The reason for placing the high frequency power source outside the mask stocker 83 is as follows. Generally, the high frequency power source is provided with an air-cooling fan for cooling. When the air-cooling fan operates, then dust, dirt and other particles are scattered. Therefore, if the high frequency power source is provided inside the mask stocker 83, these dust and others are likely to be attached to other vapor deposition masks 1. In other words, the high frequency power source provided with an air-cooling fan, which can become a dust generating source, should be provided outside the mask stocker 83, thereby the vapor deposition masks 1 inside the mask stocker 83 can effectively be kept clean. More specifically, in the configuration shown in FIG. 7, the pair of electrodes 71, 72 can be provided near a carry-out port 83a for taking in and out the vapor depositions masks 1 in the mask stocker 83 so that the corona discharge device 7 is formed. The high frequency power source is provided outside the mask stocker 83, but not shown. When a vapor deposition mask 1 is taken out, the vapor deposition mask 1 is slowly moved forward between the pair of electrodes 71, 72 so that the vapor deposition mask 1 is subjected to a modification treatment and taken out. The configuration of FIG. 7 will be described later.

Modification Treatment Device—3

In each example described above, the surface of the organic layer 51a attached to the vapor deposition mask 1 is modified by plasma irradiation. However, the modification treatment can be performed by a heating device (thermal treatment device). The atmosphere is not particularly limited, but it is preferable to perform the heat treatment, for example, in nitrogen (100% $N_2$ atmosphere) or in dry air in a container. In the case of dry air, dry air with a dew point of −50° C. or lower is particularly preferable.

For example, a heating temperature for the purpose of normal dehydration is 250° C. or higher. However, the heating temperature of the heat treatment by heater in the present embodiment is to active the surface condition of the organic layer 51a, and therefore, heating at even a lower temperature is effective. More specifically, if it is 80° C. or more, water and other impurities attached on the surface of the organic layer 51a can be scattered. However, the temperature of heat treatment is preferably 150° C. or higher, and more preferably 200° C. or higher. Further, although a metal mask can sufficiently withstand 500° C. or higher, it is preferable to keep the heating temperature of a complex type vapor deposition mask 1 using a resin film at about 400° C. or lower, because it uses polyimide or the like. Thus, the heating temperature is 500° C. or lower, preferably 400° C. or lower, and more preferably 350° C. or lower. This is because a polyimide material can sufficiently withstand up to about 400° C. The exposure time to an environment at such a temperature is about 10 minutes or more and 30 minutes or less. During about this time, the impurities on the surface of the organic layer 51a are scattered to modify the surface of the organic layer 51a.

Also in this case, it is not necessary to prepare an exclusive thermal treatment device. For example, the heat treatment can be performed in the mask stocker 83 described above. Note that similarly as in each treatment device described above, if an exclusive modification treatment device is used, the modification treatment device is provided and connected to the reduced pressure cluster 82 through a gate valve, like the relationship between the mask stocker 83 and the reduced pressure cluster 82 described above.

Modification Treatment Device—4

As another example of a modification treatment device, an ultraviolet irradiation (UV light irradiation) device is given. By applying UV light radiation to the surface of the organic layer 51a, bonds in the organic material are broken. The breaking of bonds is expected to have a surface modification effect (namely an increase in contact force by activation) on the organic layer 51a. The treatment in this case is preferably performed, for example, in air (if possible, dry air) or oxygen under a reduced pressure of about 76 Torr. The ultraviolet light is preferably a combination of ultraviolet lights of wavelengths of 185 nm and 254 nm. This is because the ultraviolet light of a wavelength of 185 nm generates ozone ($O_3$) from oxygen in the atmosphere, and "activated oxygen (=excited oxygen atoms)" having strong oxidation power is produced by irradiating ultraviolet light of a wavelength of 254 nm to this ozone. This activated oxygen is combined with the impurities attached to the surface of the organic layer 51a to remove the impurities. As a result, a strong surface modification effect is produced. As a light source, an ozone type low pressure mercury lamp using a glass to transmit ultraviolet light of a wavelength of 185 nm can be used. The low pressure mercury lamp is particularly suitable as the light source in the present embodiment, because its emission spectrum has emission characteristics such that assuming the emission at a wavelength of 253.7 nm is 100%, then the emission at 184.9 nm is 20 and some %, and the emissions at the other wavelengths are a few % or lower.

Practically, the low pressure mercury lamp is preferable as a light source of ultraviolet light of a wavelength from 185 nm to 254 nm as described above. For example, as described above, the main emission spectrum of a practically used low pressure mercury lamp has two lines that are 254 nm line and 185 nm line. Further, depending on the glass used, an ozone type low pressure mercury lamp transmits the 185 nm line, and an ozone-free type low pressure mercury lamp can block the 185 nm line, and thus, the low pressure mercury lamp can easily be used depending on the purpose.

The ultraviolet irradiation, during its process, breaks the molecular bonds in organic contamination such as oxides of organic materials or the like into "free radicals of organic compounds or molecules in excited states". Thus, it is effective to further promote chemical reactions. When chemical reactions between the activated oxygen and organic contamination are continuously promoted, then gases such as $CO_2$ or the like are volatilized and removed finally. As a result, after the ultraviolet irradiation, the surface of the organic layer 51a is modified into a hydrophilic surface. Further, radicals such as OH, COO, CO, COOH and so on are formed also on the surface of the organic layer 51a, which is an object to receive the irradiation. Thus, the ultraviolet irradiation is effective for "modification" just as it increases such radicals in many adhesives to increase their adhesive forces. An ultraviolet irradiation time of about 15 seconds is sufficient to form radicals. The purpose of the present embodiment is not to remove the organic layer 51a, and therefore, the irradiation time is not required to be very long. Further, an amount of ultraviolet radiation of 1000 $mJ/cm^2$ or more is sufficient.

Generally, the effect of the modification can be maintained for about three weeks even in air. However, the surface of the organic layer 51a is preferably activated to prevent the organic layer 51a from peeling. Therefore, it is preferable to deposit a subsequent organic material as soon as possible. The effect of the activation (radicals) is maintained for at least 2 hours after the treatment. Thus, the vapor deposition mask 1 is preferably returned into the vapor deposition chamber in high vacuum within 2 hours after the treatment. The low pressure mercury lamp is tubular-shaped, and therefore, it is possible that referring to the device shown in FIG. 7 described below, the low pressure mercury lamp is placed near the carry-out port 83a of the mask stocker 83 to sufficiently irradiate ultraviolet light to the surface of the vapor deposition mask 1, and the vapor deposition mask 1 can be transferred out to the reduced pressure cluster 82. Of course, the location to place the light source is not limited to near the mask carry-out port 83a in the mask stocker 83, and the low pressure mercury lamp can be placed in the reduced pressure cluster 82 or at another appropriate location. Note that as described above, when the modification is performed by ultraviolet irradiation, the organic material is partially exhausted as $CO_2$ or the like. Therefore, it is preferable that the vapor deposition mask 1 is once sufficiently degassed, for example, in the reduced cluster 82 before the vapor deposition mask 1 is transferred into the vapor deposition chamber 81.

Modification Treatment Device—5

A thin film manufacturing apparatus is given as another surface modification device. On the surface of the organic layer 51a, a thin film (about a few angstroms to about a few tens of nm) of a material to increase its contact force can be formed. The thin film is formed on the surface of the vapor deposition mask 1 by coating, sputtering, vacuum vapor deposition or the like. For example, a Ti (titanium) thin film of about 10 nm thick can be formed by a vacuum vapor deposition apparatus, a sputtering apparatus or the like. If such a thin film is formed, the close contact force between the organic material, which is deposited thereafter, and the organic layer 51a is increased due to the thin film intervening between them. Otherwise, a so-called silane coupling agent, which is like a surfactant, can be formed as a thin film. A manufacturing method and a manufacturing apparatus for an organic EL display device will be described in detail below.

Manufacturing Method for Organic EL Display Device

In a manufacturing method for an organic EL display device according to a first embodiment of the present invention, first, except the modification treatment process which characterizes the present embodiment, at least TFTs (not shown) and a first electrode 22 (refer to FIG. 5) are formed on the support substrate 21 (S1). More specifically, although not completely shown, switching elements such as TFTs or the like for respective RGB sub-pixels of respective pixels are formed on the support substrate 21, which is formed of glass or film, while the first electrode 22 connected to the switching elements is formed on a flattening layer by using a combination of an ITO layer and a metal layer such as Ag, APC or the like. As shown in FIG. 5, an insulating bank 23 made of $SiO_2$, an acrylic resin, a polyimide resin or the like to partition the sub-pixels is formed between the sub-pixels. The vapor deposition mask 1 described above is aligned and fixed on the insulating bank 23 of the support substrate 21.

Then, as shown in FIG. 4A, the support substrate 21 is mounted on the vapor deposition mask 1 so that an exposed surface of the first electrode 22 faces the vapor deposition mask 1 (S3). More specifically, the mounting of the support substrate 21 is performed by moving the support substrate 21 relative to the vapor deposition mask 1 while using an imaging device to observe alignment marks for alignment which are formed on the support substrate 21 and the vapor deposition mask 1, respectively. This method can match the openings 11a of the vapor deposition mask 1 with a vapor deposition region on the support substrate 21, for example, a pattern of the first electrode 22 (refer to FIG. 5). After the alignment, the vapor deposition mask 1 is attracted and brought sufficiently close thereto by a magnet (not shown) or the like. Note that each opening 11a of the vapor deposition mask 1 is formed smaller than a gap (opening) in the surface of the insulating bank 23. It achieves to prevent organic materials as much as possible from being deposited on a side wall of the insulating bank 23, thus preventing a reduction in luminous efficiency of the organic EL display device.

Figure 8:
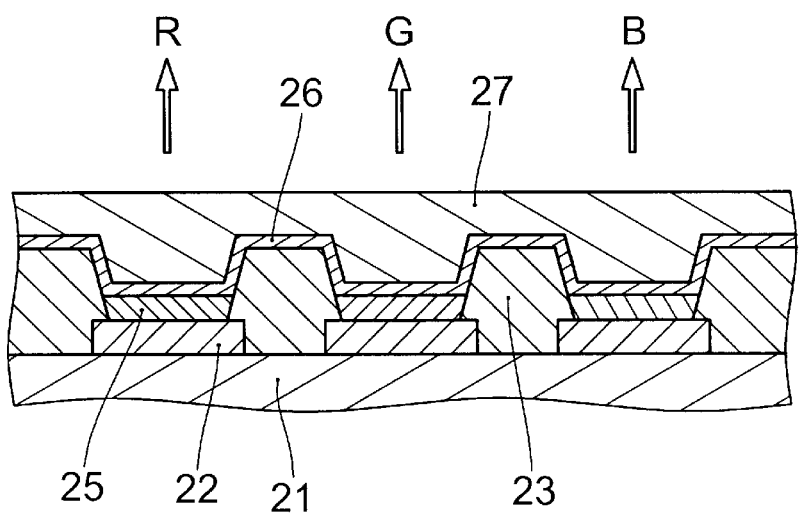
FIG. 8 is a view showing the support substrate after a second electrode forming process as one step in the flow chart of FIG. 1.

Next, an organic material is evaporated from a position (vapor deposition source 5) distant from the vapor deposition mask 1 toward a surface of the vapor deposition mask 1, which is opposite to a surface facing the support substrate 21 of the vapor deposition mask 1, so as to deposit an organic layer 25 formed of multiple layers (S4). More specifically, referring to FIG. 4A, an organic material 51 is deposited by evaporating or sublimation from the vapor deposition source 5 using a line source formed by linearly arranging crucible or the like. As a result, as shown in FIG. 5, the organic material is deposited only on the desired first electrode 22, which is exposed through the opening 11a of the vapor deposition mask 1. Here, the organic material 51 is deposited on an area of the vapor deposition mask 1 where there is no opening 11a, to form the organic layer 51a. The vapor deposition source 5 is not limited to the line source described above. As shown in FIG. 5, the opening 11a of the vapor deposition mask 1 is formed narrower than the gap in the surface of the insulating bank 23, and therefore, the organic material 51 is less likely to be deposited on the side wall of the insulating bank 23. As a result, as shown in FIGS. 5 and 8, the organic layer 25 is deposited almost only on the first electrode 22.

The deposition of the organic material 51 is sequentially performed by using different vapor deposition masks 1 or different organic materials. In this case, for mass production of the organic EL display device, a plurality of vapor deposition chambers 81 each having a device shown in FIG. 4A installed therein are prepared as shown in FIG. 6, and different vapor deposition masks 1 and so on are placed in the respective vapor deposition chambers 81. Then, the support substrate 21 is moved sequentially through the vapor deposition chambers 81 to repeat the organic material deposition so as to deposit the organic layer 25 (refer to FIG. 5 or FIG. 8) (S4). Further, different support substrates 21 are sequentially placed in the same vapor deposition chamber 81 to perform the organic material deposition. The organic material vapor deposition may in some cases be performed in common with partially other pixels. Thus, vapor deposition masks 1 with different patterns of openings 11a formed therein are prepared, and are respectively placed in the plurality of vapor deposition chambers 81 as described above. While it is moved through the vapor deposition chambers 81, the vapor deposition itself is performed similarly as in step S4 described above. If an experimental apparatus or the like is used to sequentially perform deposition of various organic materials in the same vapor deposition chamber 81, the vapor deposition mask 1 may in some cases be replaced, or the material of the vapor deposition source 5 may in other cases be replaced, to perform it sequentially. This case can also be considered as the movement or replacement of the support substrate 21.

As described above, the present embodiment is characterized in that, depending on the condition of the exposed surface of the vapor deposition mask 1 or the exposed surface of the organic layer 51a (refer to FIG. 5) deposited on the vapor deposition mask 1, a modification treatment is performed at at least one timing among: before depositing the organic layer 25 composed of multiple layers (S2 of FIG. 1); before or after depositing each organic layer of the multiple layers of the organic layer 25 (S2 via S6); and before forming the second electrode 26 (S9). It is not always necessary to perform a modification treatment when the support substrate 21 is placed in the vapor deposition chamber 81 or the support substrate 21 is moved, and its necessity is decided depending on the surface condition of the vapor deposition mask 1, or the condition of the organic layer 51a (refer to FIG. 5) deposited on the vapor deposition mask 1 as described above. The modification treatment is performed, for example: at a timing when the organic layer 51a is deposited with a thickness of at least 0.05 μm or more and 1 μm or less, and the support substrate 21 (vapor deposition mask 1) is moved or replaced; or when the surface is found to be in a condition where it is oxidized or has impurities attached thereon or is contaminated; or when the interval between vapor depositions is too long; or the like. Alternatively, the modification treatment can be performed periodically.

FIG. 5 shows the organic layer 25 as a simple single layer, but the organic layer 25 can be composed of multiple layers made of different materials. For example, as a layer to contact the first electrode (anode) 22, a hole injection layer made of a material to match it well in ionization energy to improve hole injection properties may be provided. On the hole injection layer, a hole transport layer to improve stable hole transport and enable confinement of electrons (energy barrier) in a light emitting layer is formed by using, for example, an amine group material. Further thereon, a light emitting layer selected depending on the light emission wavelength is formed by doping a red or green organic fluorescent material, for example, for red or green color into $Alq_3$. Further, a DSA group organic material is used as a blue group material. Further, on the light emitting layer, an electron transport layer to improve electron injection properties and stably transport electrons is formed by using $Alq_3$ or the like. These layers are each deposited with a thickness of about a few tens of nm to form the organic layer 25. Note that an electron injection layer such as LiF or Liq layer to improve electron injection properties may be provided between the organic layers and the metal electrode. In the present embodiment, the organic layer 25 may include each of these organic layers and inorganic layers.

In the organic layer 25, an organic material of a material for each of RGB colors may be deposited as the light emitting layer. Alternatively, the light emitting layers may be formed of the same organic material while using color filters to determine emission colors. If light emission performance is emphasized, it is preferable to deposit the hole transport layer, the electron transport layer and the like separately by using materials suitable for the light emitting layer depending on an emitting color. However, considering material cost, the same material may be used for deposition in common for two or three of the RGB colors. If the same material is deposited in common for sub-pixels of two colors or more, the vapor deposition mask 1 is formed to have openings 11a formed for the common sub-pixels. If the organic layers are respectively different for individual sub-pixels, it is possible to use one vapor deposition mask 1, for example, for R sub-pixels and sequentially deposit respective organic layers comprising the organic layer. Further, for depositing a common organic layer for RGB, organic layers for respective sub-pixels are deposited up to immediately below the position of the common organic layer, and at the time of depositing the common organic layer, a vapor deposition mask 1 having openings for respective sub-pixels of RGB is used to deposit the organic layer for all pixels at one time.

The organic layer 25 composed of entire multiple layers including the electron injection layer such as LiF layer and so on is formed. The second electrode (for example, cathode) 26 (refer to FIG. 8) is formed on a surface of the organic layer 25 deposited on the support substrate 21 over the entire surface of the support substrate 21 (S8). Since the example shown in FIG. 8 is a top emission-type device, which is a type to emit light from its surface opposite to the support substrate 21 as shown in the figure, the second electrode 26 is formed of a transparent material such as a thin Mg—Ag eutectic film. Otherwise, Al can also be used. Note that in the case of a bottom emission-type device to emit light from the support substrate 21, the first electrode 22 is made of ITO, $In_3O_4$ or the like, and the second electrode 26 uses a metal with a low work function such as Mg, K, Li, Al or the like. A protective film 27 made, for example, of $Si_3N_4$ or the like is formed on a surface of the second electrode 26. Note that its entirety is configured to be sealed by a sealing layer made of glass, resin film or the like (not shown) to prevent the organic layer 25 from absorbing water. Further, the organic layer 25 can be configured to be made common as much as possible and to have a color filter provided on a front surface thereof.

Manufacturing Apparatus for Organic EL Display Device

The manufacturing apparatus for an organic EL display device according to the second embodiment is characterized by the formation of the organic layer 25, and thus, its configuration example is shown, for example, in FIGS. 6 and 7. For example, as shown in FIG. 6, a plurality of vapor deposition chambers 81 are arranged around a reduced pressure cluster 82, while a mask stocker 83 for storing spare vapor deposition masks 1 for replacement and a modification treatment device (not shown) can be provided at a periphery of the reduced pressure cluster 82. The modification treatment device is not required to be separately provided, and can be provided in the mask stocker 83 as shown, for example in FIG. 7 or the like. Such a configuration can replace the vapor deposition mask 1 relative to the support substrate 21 by moving the support substrate 21 to a different vapor deposition chamber 81 in which a vapor deposition mask 1 and a vapor deposition source 5 (refer to FIG. 4A) that are required are placed. This configuration is suitable for mass production. Note that in FIG. 6, reference numeral 84 denotes a loader to prepare a support substrate 21 from a previous step, and reference numeral 85 denotes an unloader to transfer a support substrate 21, on which an organic layer 25 and the like have been deposited, to a next step.

As shown in FIG. 7, which shows a relationship between the reduced pressure cluster 82 and the mask stocker 83, the reduced pressure cluster 82 and the mask stocker 83 are connected through a gate valve 86. The gate valve 86 can be opened and closed. When the gate valve 86 is opened, the reduced pressure cluster 82 and the mask stocker 83 are connected to each other. Further, when the gate valve 86 is closed, the reduced pressure cluster 82 and the mask stocker 83 become independent from each other, and each internal condition is kept as it is. The reduced pressure cluster 82 has a transfer robot 82a inside.

The vapor deposition masks 1 are one by one taken out from the mask stocker 83 and transferred into a vapor deposition chamber 81 and the like by the transfer robot 82a. At this time, a gate valve (not shown) between the reduced pressure cluster 82 and the vapor deposition chamber 81 is opened and closed. This take-out is performed automatically by the transfer robot 82a, for example, while the gate valve 86 of the mask stocker 83 is opened. As described above, referring to FIG. 7, a pair of electrodes 71, 72 of a corona discharge device (corona discharge device 7) are formed near the carry-out port 83a which serves as the gate valve 86. Thus, upon this take-out, the surface of the vapor deposition mask 1, which is transferred between the pair of electrodes 71, 72 supplied with a high frequency high voltage, is modified, and the vapor deposition mask 1 is taken into the reduced pressure cluster 82 by the transfer robot 82a. Note that like the mask stocker 83, the vapor deposition chamber 81 also has a gate valve to connect with the reduced pressure cluster 82. When the transfer robot 82a in the reduced cluster 82 rotates, the vapor deposition mask 1 is moved. Also if a modification treatment device (not shown) is provided, the modification treatment device is formed into a configuration of a chamber having a gate valve like the mask stocker 83. As a result, the vapor deposition mask 1 can be taken in and out between the modification treatment device and the reduced pressure cluster 82 without being exposed to the outside air.

Note that although not shown, the configuration is made so that if the support substrate 21 (substrate for vapor deposition) is to be replaced, a substrate stocker like the mask stocker 83 is provided to likewise enable their replacement.

As shown in FIG. 4A, which is a view showing a schematic configuration of a main part, the vapor deposition chamber 81 includes therein: a substrate holder 29 provided to be able to hold a support substrate 21; a contact plate 4 provided on one surface of the support substrate 21 held by the substrate holder 29; a vapor deposition mask 1 provided facing a surface of the support substrate 21 opposite to the one surface thereof on which the contact plate 4 is provided; and a vapor deposition source 5 provided facing the vapor deposition mask 1 and provided to evaporate or sublimate a vapor deposition material. More specifically, the vapor deposition mask 1 is placed on a mask holder 15, while the substrate holder 29 and a support frame 41 for supporting the contact plate 4 are each designed to be able to be lifted up. When the support substrate 21 is transferred and placed on the substrate holder 29 by a robot arm (not shown), and the substrate holder 29 is moved down, then the support substrate 21 is brought in contact with the vapor deposition mask 1. Further, when the support frame 41 is moved down, the contact plate 4 is superposed on the support substrate 21. On top of this, an electromagnet (not shown) and the like can be provided. Note that the contact plate 4 is provided to flatten the support substrate 21 (flatten warp) and cool the support substrate 21 and the vapor deposition mask 1 by circulating cooling water therein (not shown).

As shown in FIG. 4A, the substrate holder 29 and the mask holder 15 are provided in the vapor deposition apparatus. The substrate holder 29 is connected to a driving device (not shown) to hold, by multiple hook-shaped arms, the support substrate 21 at its peripheral portions so as to allow it to move up and down. With the hook-shaped arms, the substrate holder 29 receives the support substrate 21 which has been transferred into the vapor deposition chamber 81 by a robot arm, and moves down until the support substrate 21 gets close to the vapor deposition mask 1. In order to enable the alignment, an imaging device (not shown) is also provided. The contact plate 4 is supported by the support frame 41, and is connected through the support frame 41 to the driving device which moves down the contact plate 4 until it gets in contact with the support substrate 21. By moving down the contact plate 4, the support substrate 21 is flattened. Note that although not shown, the vapor deposition chamber 81 (refer to FIG. 6), in which the entire apparatus shown in FIG. 4A is placed, comprises a device to evacuate its inside.

Figure 4B:
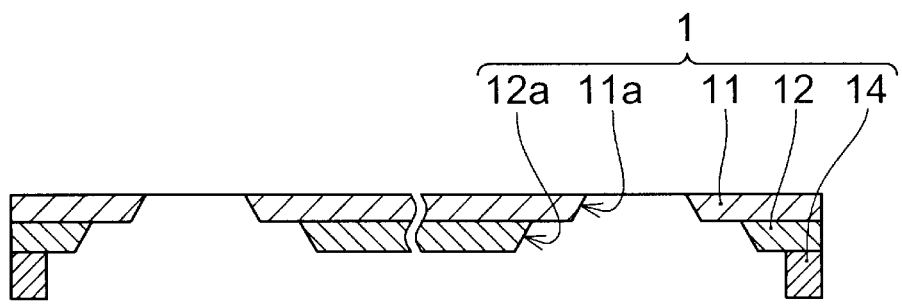
FIG. 4B is a view showing an example of the vapor deposition mask.

As shown in FIG. 4B, which is an enlarged view of an example, the vapor deposition mask 1 comprises a resin film 11, a metal support layer 12 and a frame (frame body) 14 formed around the vapor deposition mask. For the vapor deposition mask 1, as shown in FIGS. 4A and 4B, the frame 14 is placed on the mask holder 15. A magnetic material is used for the metal support layer 12, and thus, the vapor deposition mask 1 is attracted by a magnet (not shown) provided on the contact plate 4. As a result, the support substrate 21 and the vapor deposition mask 1 get close to each other.

For example, Fe, Co, Ni, Mn or their alloys can be used for the metal support layer 12. Among them, invar (alloy of Fe and Ni) is particularly preferable, because it is only slightly different in linear thermal expansion coefficient from the support substrate 21 and expands very little due to heat. The metal support layer 12 is formed to have a thickness of about 5 μm to 30 μm. It is also possible that without using the metal support layer 12, the surrounding frame 14 can be formed of a magnetic material. Even if the metal support layer 12 is thus formed, an area near the opening 11a and exposed in the opening 12a of the metal support layer 12 is only the resin film 11. Therefore, if cleaning to remove the organic layer 51a (refer to FIG. 5) attached to the vapor deposition mask 1 is performed, the opening 11a which is a most important part of the vapor deposition mask 1 is likely to be damaged. However, the present embodiment can significantly reduce the number of cleanings, and therefore, can significantly extend the life of the vapor deposition mask 1

SUMMARY (1) The manufacturing method for an organic EL display device according to a first embodiment of the present invention comprises: preparing a support substrate having at least TFTs and a first electrode formed thereon; mounting the support substrate on a vapor deposition mask placed in a vapor deposition chamber so that the first electrode faces the vapor deposition mask; evaporating an organic material from a position distant from the vapor deposition mask toward a surface of the vapor deposition mask, the surface of the vapor deposition mask being an opposite surface to a surface facing the support substrate, so as to deposit an organic layer composed of multiple layers; and forming a second electrode on the organic layer, wherein a modification treatment to modify an exposed surface of the vapor deposition mask or an exposed surface of the organic layer deposited on the vapor deposition mask is performed at at least one timing among: before depositing the organic layer composed of the multiple layers; before or after depositing each organic layer of the multiple layers composing the organic layer; and before forming the second electrode.

According to the first embodiment of the present invention, an unnecessary organic material, which is deposited in an area, other than openings, of the vapor deposition mask used to deposit the organic layer of the organic EL display device, is subjected to the modification treatment. Thus, the surface of the vapor deposition mask or the surface of the organic layer is made to be easily contacted to a subsequently deposited organic material. As a result, even if the organic layer is increased in thickness, the deposited organic material is unlikely to be partially peeled off. In other words, this significantly reduces the risk that the organic layer may be partially peeled and attached to the support substrate as a substrate for vapor deposition or the like, even if the organic layer is increased in thickness. Further, even if the thickness of the organic layer which is considered as a criterion for the cleaning is increased by about 3 to 10 times as compared with the conventional one, a problem due to the peeling off is unlikely to occur at the time of the vapor deposition.

In other words, it is possible to significantly reduce the number of cleaning steps to remove unnecessaries of the organic material deposited on the vapor deposition mask when the vapor deposition mask is used. Consequently, the number of spare vapor deposition masks required for the cleanings can be reduced. Alternately, it is possible to significantly reduce the waiting time for cleaning the vapor deposition mask, and shorten the cycle time of the vapor deposition process. As a result, the cost of the organic EL display device can be reduced.

In addition, since the number of cleanings can be reduced, a damage of the vapor deposition mask is significantly reduced. In other words, the vapor deposition mask can be used several times more than a conventional one until the next cleaning. Consequently, the expensive vapor deposition mask can be significantly saved. As a result, according to the present embodiment, the cost of the organic EL display device can be significantly reduced.

(2) The deposition of the organic layer composed of the multiple layers can be performed by moving the support substrate to a different vapor deposition chamber from the vapor deposition chamber, or by replacing the vapor deposition mask, and the modification treatment is performed when the support substrate is moved, or when the vapor deposition mask is replaced. This enables an effective production in mass production.

(3) It is preferable that the modification treatment is at least one of oxygen plasma treatment, corona treatment, thermal treatment and ultraviolet radiation treatment, because the vapor deposition mask or the surface of the organic layer of an organic material deposited on the surface thereof can be activated with a simple configuration.

(4) It is preferable that the modification treatment is performed at a timing when an organic material is newly deposited with a thickness of at least 0.05 μm or more and 1 μm or less, because it increases the close contact force.

(5) It is preferable that the modification treatment is performed in, or at a carry-out port of, a mask stocker for storing spare vapor deposition masks to replace the vapor deposition mask, or in a reduced pressure cluster for replacing the vapor deposition mask, because it makes it unnecessary to provide a new surface treatment device.

(6) If the vapor deposition mask comprises a resin film, the resin film having an opening formed to pass an organic material, and at least a peripheral area of the opening is formed only of the resin film, it is very effective because it can reduce the probability of damage due to the cleaning.

(7) The manufacturing apparatus for an organic EL display device according to a second embodiment of the present invention comprises: a vapor deposition chamber for depositing an organic material; a reduced pressure cluster connected to the vapor deposition chamber through a gate valve for taking in or out the vapor deposition mask in the vapor deposition chamber; a mask stocker connected to the reduced pressure cluster through a gate valve for storing spare vapor deposition masks; and a modification treatment device for modifying a surface of the vapor deposition mask or a surface of the organic material deposited on the vapor deposition mask.

According to the second embodiment of the present invention, a plurality of vapor deposition chambers can be arranged. Thus, by that a support substrate for organic material deposition is moved among the plurality of chambers, different organic materials can be sequentially deposited on the support substrate. The vapor deposition mask in the vapor deposition chamber can be replaced by an activated vapor deposition mask when the support substrate is transferred into another vapor deposition chamber. The number of steps to replace the vapor deposition mask does not significantly increase because alignment described above is necessary when the support substrate is mounted thereon. Further, this configuration can easily enable connection of an exclusive surface treatment device.

(8) The modification treatment device is provided inside of a different chamber from the mask stocker or the reduced pressure cluster, the different chamber being connected to the reduced pressure cluster through a gate valve. This configuration facilitates the modification treatment without re-processing an existing mask stocker or the like.

(9) The modification treatment device can comprise: a pair of electrodes provided in the mask stocker or near a carry-out port thereof for taking in or out the vapor deposition mask; and a power source provided outside the mask stocker for applying a high frequency high voltage to the pair of electrodes. This configuration makes it unnecessary to provide a special surface modification treatment device. In this case, since the power source for applying a high frequency high voltage is provided outside the mask stocker, the vapor deposition mask placed in the mask stocker can be prevented from being contaminated as described above.

(10) The modification treatment device can be formed of: a gas supply source for supplying a plasma generating gas of nitrogen or oxygen in the mask stocker or the reduced pressure cluster; and a high frequency power source capable of forming a high frequency electric field. This configuration also makes it unnecessary to provide an exclusive surface modification treatment device.

(11) The modification treatment device can comprise: a container filled with nitrogen or dry air; and a heater for keeping inside the container at 80° C. or more and 500° C. or less. This configuration can make the device simple and inexpensive because it only provides a simple heater.

(12) It is preferable that the dry air is a dry air with a dew point of −50° C. or lower, because it reliably performs a surface activation treatment.

(13) The modification treatment device can comprise: a container for containing the vapor deposition mask; and an ultraviolet light supply device for supplying ultraviolet light to be irradiated to the surface of the vapor deposition mask in the container. This configuration only requires to provide a low pressure mercury lamp, and thus, it can be easily provided in the mask stocker or the reduced pressure cluster described above.

(14) It is preferable that the ultraviolet light to be irradiated is ultraviolet light of 185 nm and/or 254 nm. This is because the ultraviolet light of a wavelength of 185 nm generates ozone ($O_3$) from oxygen in the atmosphere, and activated oxygen having strong oxidation power is produced by irradiating ultraviolet light of a wavelength of 254 nm to this ozone. This activated oxygen is combined with the impurities attached to the surface of the organic layer 51a to remove the impurities.

(15) It is preferable that the ultraviolet light supply device is a low pressure mercury lamp, because the emission spectrum of the low pressure mercury lamp has peaks at 185 nm and 254 nm

REFERENCE SIGNS LIST

1 Vapor deposition mask
4 Contact plate
5 Vapor deposition source
6 Plasma generating device
7 Corona discharge device
11 Resin film
11a Opening
12 Metal support layer
12a Opening
14 Frame
15 Mask holder
21 Support substrate
22 First electrode 23 Insulating bank
25 Organic layer
26 Second electrode
27 Protective film
29 Substrate holder
41 Support frame
51 Organic material
51a Organic layer
61 Plasma chamber
62 Process chamber
63 Silicon shield plate
64 Bottom plate
65 Coil
66 High frequency power source
67 Neutral particles
69 Mask holder
71,72 Electrode
73 Dielectric material
74 Filamentary plasma
75 Power source
81 Vapor deposition chamber
82 Reduced pressure cluster
82a Transfer robot
83 Mask stocker
83a Carry-out port
84 Loader
85 Unloader
86 Gate valve

The invention claimed is:

1. A manufacturing method for an organic EL display apparatus comprising:
preparing a support substrate having at least TFTs and a first electrode formed thereon;
mounting the support substrate on a vapor deposition mask placed in a vapor deposition chamber so that the first electrode faces the vapor deposition mask;
evaporating an organic material from a position distant from the vapor deposition mask toward a surface of the vapor deposition mask, the surface of the vapor deposition mask being an opposite surface to a surface facing the support substrate, so as to deposit an organic layer comprising multiple layers; and
forming a second electrode on the organic layer,
wherein a modification treatment to activate an exposed surface of an organic material of at least an organic layer deposited on the vapor deposition mask is performed while leaving the organic material deposited, at one or more timings of: before depositing the organic layer comprising the multiple layers; after depositing the organic layer comprising the multiple layers; and before forming the second electrode.

2. The manufacturing method according to claim 1, wherein the deposition of the organic layer comprising the multiple layers is performed by moving the support substrate to a different vapor deposition chamber from the vapor deposition chamber, or by replacing the vapor deposition mask, and the modification treatment is performed when the support substrate is moved, or when the vapor deposition mask is replaced.

3. The manufacturing method according to claim 1, wherein the modification treatment is at least one of oxygen plasma treatment, corona treatment, thermal treatment and ultraviolet radiation treatment.

4. The manufacturing method according to claim 2, wherein the modification treatment is performed at a timing when an organic material is newly deposited with a thickness of 0.05 µm or more and 1 µm or less.

5. The manufacturing method according to claim 1, wherein the modification treatment is performed in, or at a carry-out port of, a mask stocker for storing spare vapor deposition masks to replace the vapor deposition mask, or in a reduced pressure cluster for replacing the vapor deposition mask.

6. The manufacturing method according to claim 1, wherein the vapor deposition mask comprises a resin film, the resin film having an opening formed to pass an organic material, and at least a peripheral area of the opening is formed only of the resin film.

7. A manufacturing apparatus for an organic EL display apparatus comprising:
a vapor deposition chamber for depositing an organic material;
a reduced pressure cluster connected to the vapor deposition chamber through a gate valve for taking in or out the vapor deposition mask in the vapor deposition chamber;
a mask stocker connected to the reduced pressure cluster through a gate valve for storing a spare vapor deposition mask; and
a modification treatment device for activating a surface of an organic material deposited on the vapor deposition mask while leaving the organic material deposited
wherein the modification treatment device comprises:
a pair of electrodes provided in the mask stocker or near a carry-out port thereof for taking in or out the vapor deposition mask; and
a power source provided outside the mask stocker for applying a high frequency high voltage to the pair of electrodes.

8. The manufacturing apparatus according to claim 7, wherein the modification treatment device further comprises a gas supply source for supplying a plasma generating gas of nitrogen or oxygen in the mask stocker or the reduced pressure cluster, and
wherein the power source comprises a high frequency power source capable of forming a high frequency electric field.

9. The manufacturing apparatus according to claim 7, wherein the modification treatment device further comprises:
a container filled with nitrogen or dry air; and
a heater for keeping inside the container at 80° C. or more and 500° C. or less.

10. The manufacturing apparatus according to claim 9, wherein the dry air is a dry air with a dew point of −50° C. or lower.

11. The manufacturing method according to claim 3, the manufacturing method further comprising:
performing the ultraviolet radiation treatment by supplying, by an ultraviolet light supply device, ultraviolet light to the surface of the vapor deposition mask.

12. The manufacturing method according to claim 11, wherein the ultraviolet light to be irradiated is ultraviolet light of 185 nm and/or 254 nm.

13. The manufacturing method according to claim 11, the manufacturing method further comprising:
supplying the ultraviolet light from a low pressure mercury lamp.

14. The manufacturing method according to claim 1, wherein the modification treatment is performed such that the exposed surface has an irregularity of 0.01 µm or more and 0.05 µm or less.

15. The manufacturing apparatus according to claim 7, wherein the modification treatment device is an activation device which activates the surface of the organic material deposited on the vapor deposition mask.

\* \* \* \* \*